(12) United States Patent
Woo et al.

(10) Patent No.: US 11,698,664 B2
(45) Date of Patent: Jul. 11, 2023

(54) ELECTRONIC APPARATUS

(71) Applicant: Samsung Display Co., Ltd., Yongin-Si (KR)

(72) Inventors: Seung-Gyun Woo, Hwaseong-si (KR); Jun-Woo Kim, Hwaseong-si (KR); Euiri Cho, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 134 days.

(21) Appl. No.: 16/872,565

(22) Filed: May 12, 2020

(65) Prior Publication Data

US 2021/0011519 A1  Jan. 14, 2021

(30) Foreign Application Priority Data

Jul. 11, 2019  (KR) .................. 10-2019-0084051

(51) Int. Cl.
*G06F 1/16* (2006.01)
*H10K 59/40* (2023.01)

(52) U.S. Cl.
CPC .......... *G06F 1/1658* (2013.01); *G06F 1/1618* (2013.01); *H10K 59/40* (2023.02)

(58) Field of Classification Search
CPC .... G06F 1/1618; G06F 1/1658; G06F 1/1652; H01L 51/5253; H01L 27/323; H10K 59/40
See application file for complete search history.

(56) References Cited

U.S. PATENT DOCUMENTS

| | | | |
|---|---|---|---|
| 10,304,913 | B2 | 5/2019 | Choi et al. |
| 2007/0081818 | A1* | 4/2007 | Castaneda ............ H04N 5/2259 396/429 |
| 2012/0050632 | A1* | 3/2012 | Shih .................. G02F 1/133514 349/42 |
| 2013/0201621 | A1* | 8/2013 | Song ........................ H05K 7/16 361/679.27 |
| 2013/0258234 | A1 | 10/2013 | Park et al. |
| 2016/0095172 | A1* | 3/2016 | Lee ...................... C23C 16/401 313/504 |
| 2017/0147040 | A1* | 5/2017 | Han ...................... G06F 1/1656 |
| 2019/0011954 | A1* | 1/2019 | Chu ....................... B32B 17/06 |
| 2019/0025673 | A1 | 1/2019 | Pilliod et al. |
| 2019/0072997 | A1 | 3/2019 | Cha et al. |
| 2019/0343010 | A1* | 11/2019 | Ji ......................... H05K 5/0017 |
| 2020/0136069 | A1* | 4/2020 | Paek ...................... B32B 27/06 |

FOREIGN PATENT DOCUMENTS

| | | |
|---|---|---|
| KR | 10-1406129 | 6/2014 |
| KR | 10-2017-0066767 | 6/2017 |
| KR | 10-2019-0025382 | 3/2019 |

* cited by examiner

*Primary Examiner* — Abbas I Abdulselam
(74) *Attorney, Agent, or Firm* — F. Chau & Associates, LLC

(57) ABSTRACT

An electronic apparatus includes an electronic panel having a penetration hole that penetrates the electronic panel. An electronic module overlaps the penetration hole in a thickness direction of the electronic apparatus. A window is spaced apart from the electronic module in the thickness direction of the electronic apparatus. The electronic panel is interposed between the window and the electronic module. A supporter is disposed between the window and the electronic module. The supporter is disposed in a main penetration hole formed at least partially by the penetration hole that penetrates the electronic panel.

18 Claims, 10 Drawing Sheets

ELECTRONIC APPARATUS

CROSS-REFERENCE TO RELATED APPLICATIONS

This application claims priority under 35 U.S.C. § 119 to Korean Patent Application No. 10-2019-0084051, filed on Jul. 11, 2019, in the Korean Intellectual Property Office, the disclosure of which is incorporated by reference in its entirety herein.

1. TECHNICAL FIELD

The present disclosure relates to an electronic apparatus, and more particularly, to an electronic apparatus that includes an electronic module.

2. DISCUSSION OF RELATED ART

An electronic apparatus is a device that is activated by an electrical signal. The electronic apparatus may include a display unit for displaying an image and/or a sensing unit for sensing an external input. A display unit having an organic light emitting display panel provides various technical advantages, such as low power consumption, high brightness, and a fast response speed.

The electronic apparatus may include an electronic module which is configured to receive an external signal or to provide an output signal to an external device. The electronic module of the electronic apparatus may be contained in an external case along with the display panel.

SUMMARY

An exemplary embodiment of the present inventive concepts provides an electronic apparatus that is configured to have a reduced bezel area and improved durability.

According to an exemplary embodiment of the present inventive concepts, an electronic apparatus includes an electronic panel having a penetration hole that penetrates the electronic panel. An electronic module overlaps the penetration hole in a thickness direction of the electronic apparatus. A window is spaced apart from the electronic module in the thickness direction of the electronic apparatus. The electronic panel is interposed between the window and the electronic module. A supporter is disposed between the window and the electronic module. The supporter is disposed in a main penetration hole formed at least partially by the penetration hole that penetrates the electronic panel.

In an exemplary embodiment, the supporter may have an elastic property.

In an exemplary embodiment, the supporter may be optically transparent.

In an exemplary embodiment, the supporter may have a shape of a convex lens, when viewed in a sectional view.

In an exemplary embodiment, the electronic apparatus may further include an adhesion layer, which is disposed between the supporter and the window to combine the supporter and the window to each other.

In an exemplary embodiment, the electronic apparatus may further include an adhesion layer, which is disposed between the supporter and the electronic module to combine the supporter and the electronic module to each other.

In an exemplary embodiment, the adhesion layer may expose at least a portion of the supporter.

In an exemplary embodiment, at least a portion of the electronic module may be inserted in the penetration hole.

In an embodiment, the electronic apparatus may further include an optical film, which is disposed between the electronic panel and the window, and an adhesion layer, which is disposed between the optical film and the window. The optical film may have a hole, which is overlapped with the penetration hole and is defined to penetrate the optical film.

In an exemplary embodiment, the adhesion layer may be optically transparent.

In an exemplary embodiment, the adhesion layer may have a hole, which is overlapped with the penetration hole and is defined to penetrate the adhesion layer.

In an exemplary embodiment, the adhesion layer may be overlapped with the penetration hole, and the supporter may be attached to the adhesion layer.

In an embodiment, the window may be foldable along a predetermined folding axis.

In an exemplary embodiment, the window may have a thickness of about 50 µm or less.

According to an exemplary embodiment of the present inventive concepts, an electronic apparatus includes an electronic panel having a penetration hole that penetrates the electronic panel. An electronic module having at least a portion of the electronic module is positioned within the penetration hole. A flexible window is disposed on the electronic panel and is configured to cover the penetration hole. A supporter overlaps with the penetration hole and is disposed between the electronic module and the window.

In an exemplary embodiment, the supporter may have an elastic property.

In an exemplary embodiment, the electronic panel may include a base layer, a pixel layer, which is disposed on the base layer and includes a plurality of pixels, and an encapsulation layer disposed on the pixel layer. The penetration hole may penetrate at least the base layer.

In an exemplary embodiment, the window may include polyimide or glass.

In an exemplary embodiment, the supporter may have a shape of a convex lens.

In an exemplary embodiment, the supporter may be optically transparent.

According to an exemplary embodiment of the present inventive concepts, a method for manufacturing an electronic apparatus includes forming an electronic panel having a penetration hole that penetrates the electronic panel. An electronic module is formed that overlaps the penetration hole in a thickness direction of the electronic apparatus. A window that is spaced apart from the electronic module is formed in the thickness direction of the electronic apparatus. The electronic panel is interposed between the window and the electronic module. A supporter between the window and the electronic module is formed in a main penetration hole formed at least partially by the penetration hole. The supporter is configured to prevent deformation of the window.

BRIEF DESCRIPTION OF THE DRAWINGS

Exemplary embodiments of the present inventive concepts will be more clearly understood from the following brief description taken in conjunction with the accompanying drawings. The accompanying drawings represent non-limiting, exemplary embodiments as described herein.

Figure 1:
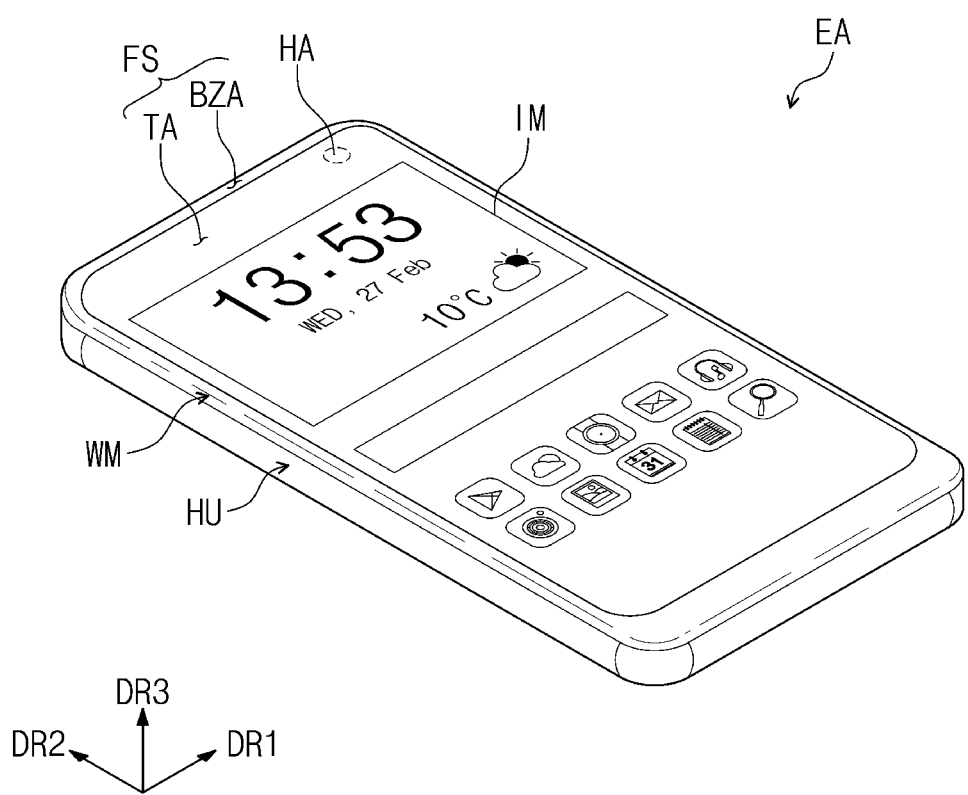
FIG. 1 is a perspective view illustrating an electronic apparatus according to an exemplary embodiment of the present inventive concepts.

It should be noted that these figures are intended to illustrate the general characteristics of methods, structures and/or materials utilized in certain exemplary embodiments and to supplement the written description provided below. These drawings are not, however, to scale and may not precisely reflect the precise structural or performance characteristics of any given embodiment, and should not be interpreted as defining or limiting the range of values or properties encompassed by the exemplary embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF THE EXEMPLARY EMBODIMENTS

Exemplary embodiments of the present inventive concepts will now be described more fully with reference to the accompanying drawings. Exemplary embodiments of the present inventive concepts may, however, be embodied in many different forms and should not be construed as being limited to the exemplary embodiments set forth herein. In the drawings, the thicknesses of layers and regions are exaggerated for clarity. Like reference numerals in the drawings denote like elements, and thus their description will be omitted.

It will be understood that when an element is referred to as being "connected" or "coupled" to another element, the element may be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on", etc.).

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be described as a second element, component, region, layer or section without departing from the teachings of example embodiments.

Spatially relative terms, such as "beneath," "below," "lower," "above," "upper" and the like, may be used herein for ease of description to describe the relationship of an element(s) or feature(s) to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the exemplary embodiments of the present inventive concepts. As used herein, the singular forms "a", "an" and "the" are intended to include the plural forms as well, unless the context clearly indicates otherwise. It will be further understood that the terms "comprises", "comprising", "includes" and/or "including", if used herein, specify the presence of stated features, integers, steps, operations, elements and/or components, but do not preclude the presence or addition of one or more other features, integers, steps, operations, elements, components and/or groups thereof.

Exemplary embodiments of the present inventive concepts are described herein with reference to cross-sectional illustrations that are schematic illustrations of idealized embodiments (and intermediate structures) of exemplary embodiments. As such, variations from the shapes of the illustrations as a result, for example, of manufacturing techniques and/or tolerances, are to be expected. Thus, exemplary embodiments of the present inventive concepts should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which exemplary embodiments of the present inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2A:
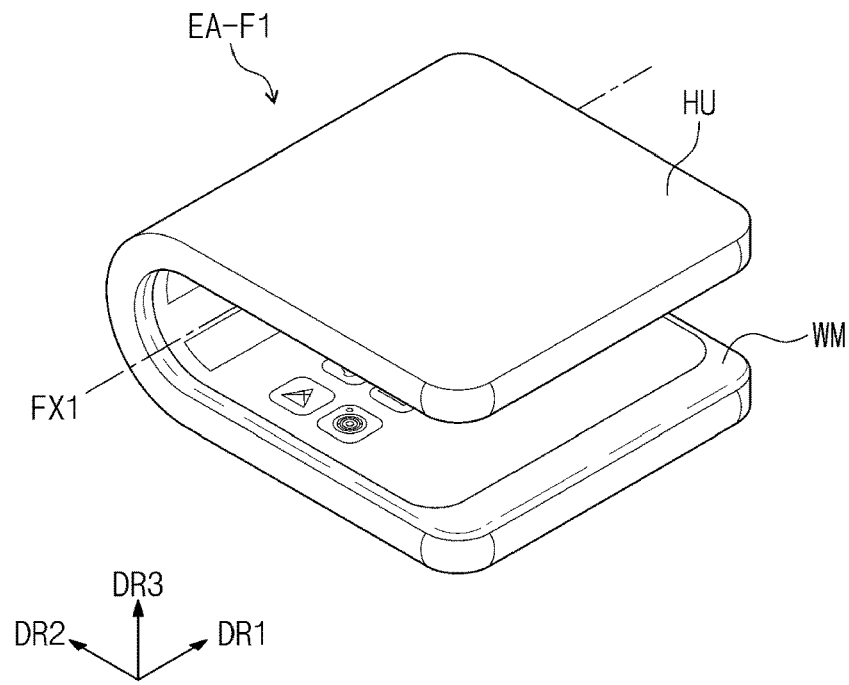
FIGS. 2A and 2B are perspective views illustrating an electronic apparatus in a first mode and second mode, respectively, according to exemplary embodiments of the present inventive concepts.
Figure 2B:
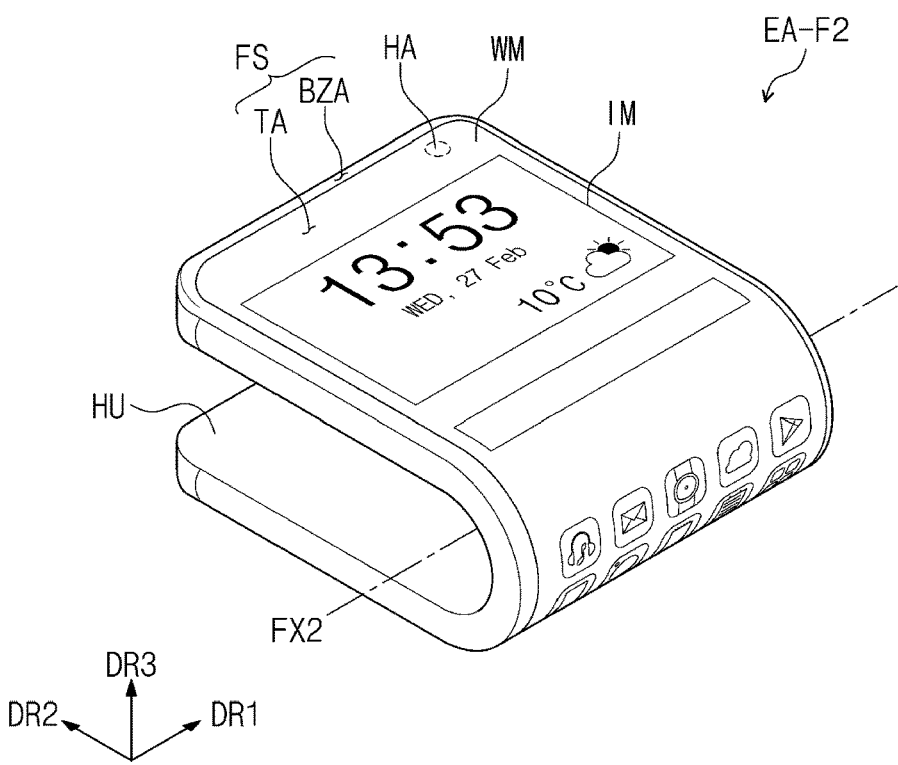

FIG. 1 is a perspective view illustrating a combined structure of an electronic apparatus according to an exemplary embodiment of the present inventive concept. FIGS. 2A and 2B are perspective views illustrating an electronic apparatus according to exemplary embodiments of the present inventive concepts. FIG. 2A illustrates a perspective view of an electronic apparatus EA of FIG. 1 in a first mode, and FIG. 2B illustrates a perspective view of the electronic apparatus EA in a second mode. Hereinafter, an exemplary embodiment of the present inventive concepts will be described with reference to FIGS. 1 to 2B.

The electronic apparatus EA may be selectively activated by an electrical signal applied thereto. The electronic apparatus EA may be a variety of electronic devices. For example, in the exemplary embodiment shown in FIG. 1, the electronic apparatus EA is a smartphone. However, in other exemplary embodiments, the electronic apparatus EA may be a tablet, notebook, computer, smart television, etc.

The electronic apparatus EA may display the image IM on the transmission region TA. The image IM may be at least one of still and moving images. FIG. 1 illustrates a clock and a plurality of icons as a non-limiting example of the image IM.

The transmission region TA may have a variety of shapes, such as a tetragonal or rectangular shape having sides that extend in a first direction DR1 or a second direction DR2. However, the exemplary embodiments of the present inventive concepts are not limited thereto and the transmission region TA may have a variety of shapes.

The bezel region BZA may be disposed on the periphery of the transmission region TA. For example, in the exemplary embodiment shown in FIG. 1, the bezel region BZA may be arranged on the periphery of the transmission region in the first direction DR1 and/or second direction DR2. The bezel region BZA may surround (e.g., enclose) the transmission region TA. However, exemplary embodiments of the present inventive concepts are not limited thereto, and in other exemplary embodiments, the bezel region BZA may be disposed adjacent to three or less side regions of the transmission region TA or may be omitted altogether. The electronic apparatus EA may be implemented as various embodiments, and exemplary embodiments of the present inventive concepts are not limited to a specific exemplary embodiment.

Figure 3A:
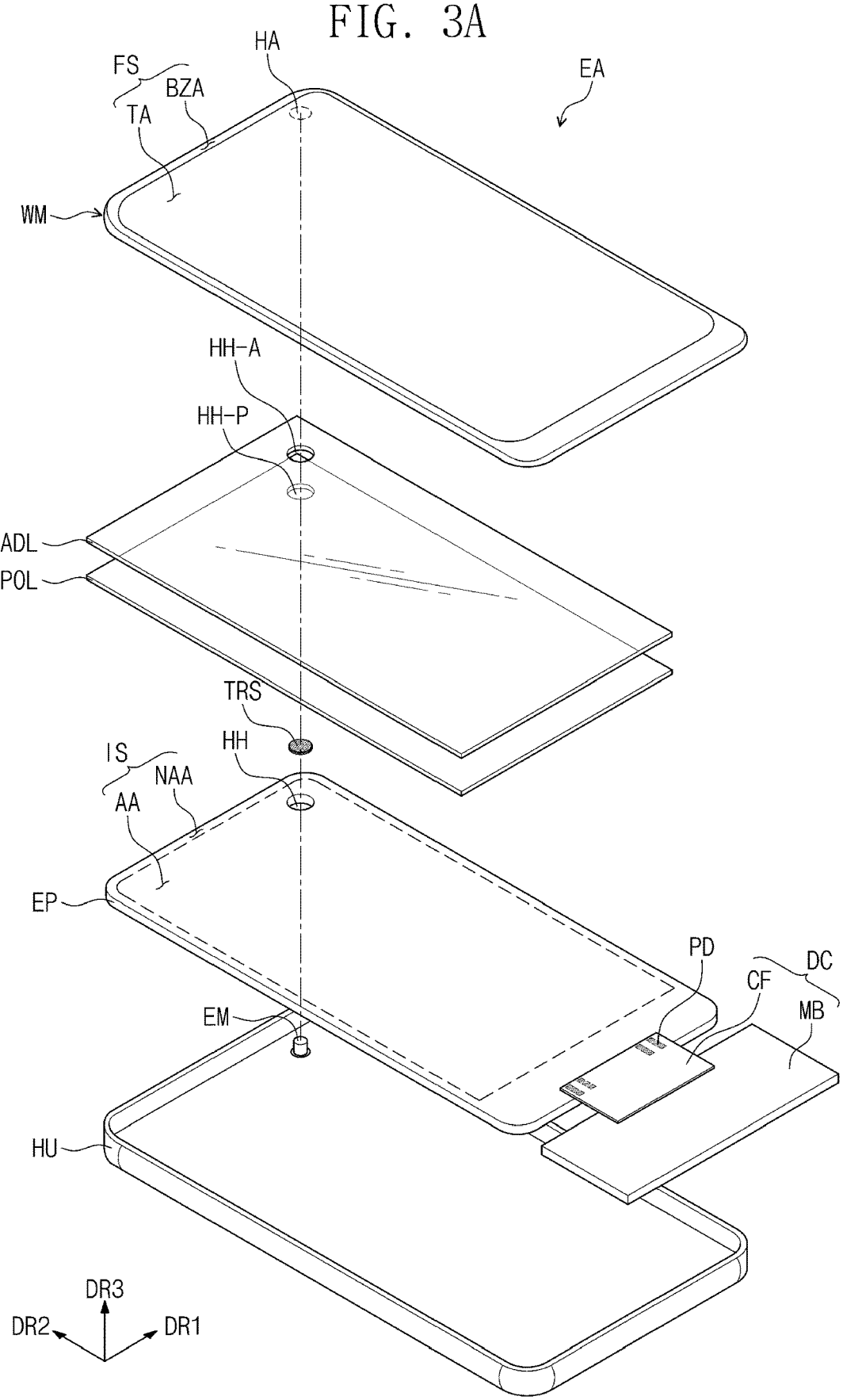
FIG. 3A is an exploded perspective view illustrating an electronic apparatus according to an exemplary embodiment of the present inventive concepts.

A hole region HA may be defined in the electronic apparatus EA according to the present exemplary embodiment. In an exemplary embodiment shown in FIG. 3A, the hole region HA may be positioned to overlap the electronic module EM (FIG. 3A). For example, the hole region HA may overlap the electronic module EM in a third direction DR3 that is substantially perpendicular to the first direction DR1 and the second direction DR2. In an exemplary embodiment, the hole region HA may be a region, in which a camera for taking a picture of an external object or an optical sensor for sensing light is disposed. However, exemplary embodiments of the present inventive concepts are not limited thereto. The image IM may be displayed through a region enclosing at least a portion of an edge of the hole region HA. For example, in an exemplary embodiment, the image IM may be displayed through a region enclosing the entire hole region HA. This will be described in more detail below.

In the present exemplary embodiment, a front or top surface and a rear or bottom surface of each element or member may be defined, based on a display direction of the image IM. The front and rear surfaces may be two opposite surfaces facing each other in the third direction DR3. For example, as shown in the exemplary embodiment of FIG. 1, the front surface FS of the electronic apparatus EA may be a top surface (e.g., in the third direction DR3) which include the transmission region and a top surface of the bezel BZA. The front surface FS may extend in the first direction DR1 and second direction DR2. The third direction DR3 may correspond to a thickness direction DR3 of the electronic apparatus EA.

Directions indicated by the first to third directions DR1, DR2, and DR3 may be relative concepts, and in certain exemplary embodiments, they may be used to indicate other directions. Hereinafter, first to third directions may be directions indicated by the first to third directions DR1, DR2, and DR3, respectively, and will be referenced with the same reference numbers.

The external appearance of the electronic apparatus EA may be defined by a window WM and an external case HU. The front surface FS of the electronic apparatus EA may be substantially defined in the window WM. In an exemplary embodiment, the external case HU may include a bottom surface (e.g., extending in the first direction DR1 and second direction DR2) and four sidewalls (e.g., extending in the third direction DR3).

As shown in FIGS. 2A and 2B, the electronic apparatus EA may be folded along predetermined folding axes FX1 and FX2, respectively. In FIG. 2A, the electronic apparatus EA-F1 may be folded along a first folding axis FX1. In the exemplary embodiment shown in FIG. 2A, the first folding axis FX1 of the electronic apparatus EA-F1 may be defined on the window WM. Accordingly, when the electronic apparatus EA-F1 is in a first mode, the electronic apparatus EA-F1 may be folded in a manner so that the external case HU faces outwardly to the external environment and the portions of the window WM divided by the first folding axis FX1 face each other.

In another exemplary embodiment shown in FIG. 2B, an electronic apparatus EA-F2 may be folded along a second folding axis FX2 defined on the external case HU. Accordingly, when the electronic apparatus EA-F2 is in the second mode, the electronic apparatus EA-F2 may be folded in a manner so that the window WM faces outwardly to the external environment and the portions of the external case HU divided by the second folding axis FX2 face each other. In this exemplary embodiment, an image, which is displayed by the electronic apparatus FA-F2, may be easily viewed by a user, even when the electronic apparatus EA-F2 is in a folded state.

In an exemplary embodiment of the present inventive concepts, the electronic apparatus EA may include both the first folding axis FX1 and the second folding axis FX2. In this exemplary embodiment, depending on a direction of an external force exerted on the electronic apparatus EA, the electronic apparatus EA may be deformed to the electronic apparatus EA-F1 of the first mode or the electronic apparatus EA-F2 of the second mode. However, in other exemplary embodiments, the first folding axis FX1 or the second folding axis FX2 may be selectively located in different positions on the electronic apparatus EA. Furthermore, the extension directions of the first and second folding axes FX1 and FX2 are not limited to those shown in FIGS. 2A and 2B and may be defined in various different directions in other exemplary embodiments of the present inventive concepts.

The electronic apparatus EA according to an exemplary embodiment of the present inventive concepts may be folded along the folding axes FX1 and FX2. However, exemplary embodiments of the present inventive concepts are not limited thereto, and in an exemplary embodiment, the electronic apparatus EA may not be configured to be foldable and may be rigid.

Figure 3B:
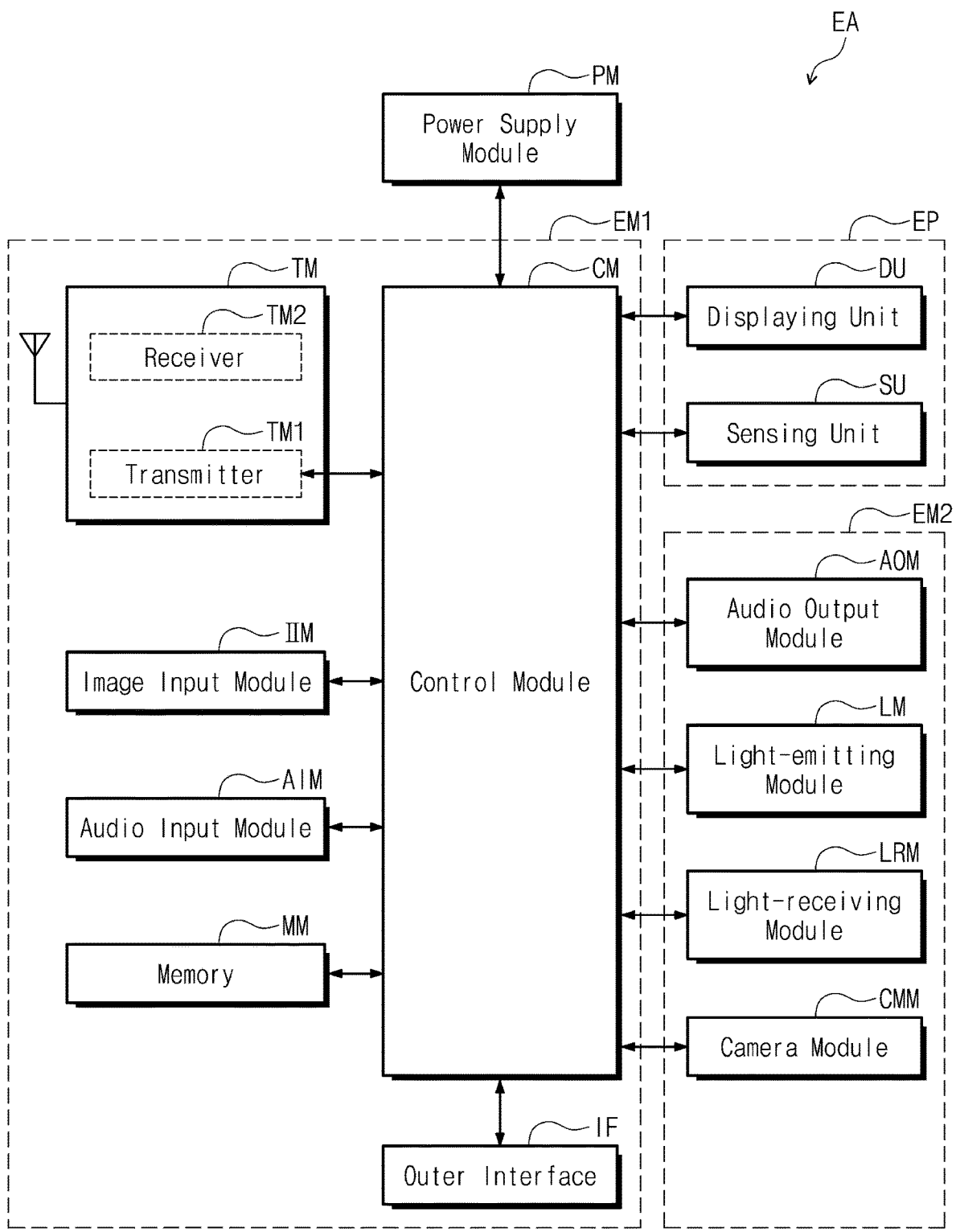
FIG. 3B is a block diagram of the electronic apparatus shown in FIG. 3A according to an exemplary embodiment of the present inventive concepts.

FIG. 3A is an exploded perspective view illustrating an electronic apparatus according to an exemplary embodiment of the present inventive concepts. FIG. 3B is a block diagram of the electronic apparatus shown in FIG. 3A according to an exemplary embodiment of the present inventive concepts. Hereinafter, an exemplary embodiment of the present inventive concepts will be described with reference to FIGS. 3A and 3B.

As shown in FIG. 3A, the electronic apparatus EA may include a window WM, an electronic panel EP, an optical film POL, an adhesion layer ADL, a circuit substrate DC, an electronic module EM, a supporter TRS, and an external case HU. As described above, the window WM and the external case HU may be combined with each other to define an external appearance of the electronic apparatus EA.

The window WM may be disposed on the electronic panel EP to cover a front surface IS of the electronic panel EP. For example, as shown in the exemplary embodiment of FIG. 3A, a bottom surface of the window WM may be disposed on the front surface IS of the electronic panel EP (e.g., in the third direction DR3) with the optical film POL and adhesive layer ADL disposed therebetween. The window WM may include an optically transparent insulating material. In addition, the window WM may be ductile or flexible. For example, in an exemplary embodiment, the window WM may include a resin film or a resin substrate, which includes polyimide, or a thin glass substrate. However, exemplary embodiments of the present inventive concepts are not limited thereto.

The window WM may have a multi-layered or a single layer structure. For example, in an exemplary embodiment the window WM may have a multi-layered stacking structure which includes a plurality of plastic films that are coupled to each other by an adhesive layer or a glass substrate and a plastic film which are coupled to each other by an adhesive layer. However, exemplary embodiments of the present inventive concepts are not limited thereto.

The window WM may include the front surface FS of the electronic apparatus EA that faces outwardly to the external environment and is exposed thereto. The front surface FS of the electronic apparatus EA may be substantially defined by the front surface (e.g., the top surface in the third direction DR3) of the window WM. The transmission region TA may be an optically transparent region. The transmission region TA may have a shape corresponding to an active region AA of the electronic panel EP disposed therebelow. For example, the transmission region TA may overlap (e.g., in the third direction DR3) at least a portion of the front surface of the active region AA. The image IM which is displayed on the active region AA of the electronic panel EP may be emitted to the outside through the transmission region TA.

In an exemplary embodiment, the bezel region BZA may have a relatively low optical transmittance as compared with the transmission region TA. The bezel region BZA surrounds the transmission region TA and may define a shape of the transmission region. The bezel region BZA may be adjacent to the transmission region TA and may enclose the transmission region TA.

In an exemplary embodiment, the bezel region BZA may have a predetermined color. In an embodiment in which the window WM is provided in the form of a glass or plastic substrate, the bezel region BZA may be a color layer, which is printed or deposited on a surface of the glass or plastic substrate. In certain exemplary embodiments, the bezel region BZA may be formed by coloring a corresponding region of the glass or plastic substrate.

The bezel region BZA may cover a peripheral region NAA of the electronic panel EP. The bezel region BZA may prevent the peripheral region NAA from being visible to a user. However, exemplary embodiments of the present inventive concepts are not limited thereto and in other exemplary embodiments, the window WM may not include the bezel region BZA.

The electronic panel EP may display the image IM. The electronic panel EP may include the front surface IS, which includes the active region AA and the peripheral region NAA. The active region AA may be a region, which is activated by an electrical signal applied thereto.

In the exemplary embodiment shown in FIG. 3A, the active region AA is a region on which the image IM is displayed. The transmission region TA may overlap with at least the active region AA (e.g., in the third direction DR3). For example, the transmission region TA may overlap with at least a portion of the front surface of the active region AA. Accordingly, a user may view the image IM through the transmission region TA.

The peripheral region NAA may be a region covered with the bezel region BZA. The peripheral region NAA may be adjacent to the active region AA. For example, the peripheral region NAA may be adjacent to the active region AA in the first direction DR and/or second direction DR2. As shown in the exemplary embodiment of FIG. 3A, the peripheral region NAA surrounds the active region AA.

Various signal lines or pads PD, which are used to provide electrical signals to the active region AA, or electronic components may be disposed in the peripheral region NAA. The peripheral region NAA may be covered with the bezel region BZA and may not be visible to a user.

As shown in the exemplary embodiment of FIG. 3A, the electronic panel EP may be assembled in a flat state, in which the active region AA and the peripheral region NAA face the window WM. However, exemplary embodiments of the present inventive concepts are not limited thereto. For example, in other exemplary embodiments the peripheral region NAA of the electronic panel EP may be partially curved. In this embodiment, a portion of the peripheral region NAA may face a rear surface of the electronic apparatus EA, and an area of the bezel region BZA in the front surface of the electronic apparatus EA may be reduced. In an exemplary embodiment, the electronic panel EP may be assembled in a state, in which a portion of the active region AA is curved. In other exemplary embodiments, the peripheral region NAA may be omitted from the electronic panel EP.

A hole HH may be defined in the electronic panel EP to penetrate the electronic panel EP. At least a portion of the hole HH may be enclosed by the active region AA. For example, as shown in the exemplary embodiment of FIG. 3A, the entire portion of the edge of the hole HH is enclosed by the active region AA. In the exemplary embodiment shown in FIG. 3A, the hole HH is spaced apart from the peripheral region NAA. However, exemplary embodiments of the present inventive concepts are not limited thereto. For example, in another exemplary embodiment, at least a portion of the hole HH is adjacent to the peripheral region NAA and only a portion of the hole HH is enclosed by the active region AA. In an exemplary embodiment, the hole HH may be defined in a position that overlaps with the transmission region TA (e.g., in the third direction DR3) and is spaced apart from the bezel region BZA.

The circuit substrate DC may be connected to the electronic panel EP. In an exemplary embodiment, the circuit substrate DC may include a flexible substrate CF and a main substrate MB. The flexible substrate CF may include an insulating film and conductive lines mounted on the insulating film. The conductive lines may be coupled to the pads PD to electrically connect the circuit substrate DC to the electronic panel EP.

In an exemplary embodiment of the present inventive concepts, the flexible substrate CF may be assembled in a curved state. Therefore, the main substrate MB may be disposed on a rear surface of the electronic panel EP and may be stably contained in a space provided by the external case HU (e.g., a space between a rear surface of the electronic panel EP and a bottom surface and sidewalls of the external case HU). However, in another exemplary embodiment, the flexible substrate CF may be omitted and the main substrate MB may be directly coupled to the electronic panel EP.

The main substrate MB may include signal lines and electronic components. The electronic components may be coupled to the signal lines and may be electrically connected to the electronic panel EP. The electronic components may generate various electrical signals (e.g., for generating the image IM, for sensing an external input, etc.) or process sensed signals. In an exemplary embodiment, the main substrate MB may include a plurality of electronic components provided to correspond to respective electric signals which will be generated or processed. However, exemplary embodiments of the present inventive concepts are not limited thereto.

In an exemplary embodiment of the present inventive concepts, the driving circuit, which provides electrical signals to the active region AA, may be mounted directly on the electronic panel EP. For example, the driving circuit may be mounted in the form of a chip or may be formed along with pixels PX. In this embodiment, an area of the circuit substrate DC may be reduced or omitted. However, exemplary embodiments of the present inventive concepts are not limited thereto.

The optical film POL may be disposed between the window WM and the electronic panel EP (e.g., in the third direction DR3). The optical film POL may reduce reflectance of the electronic panel EP to light which is incident on the electronic panel from the external environment outside of the window WM. In an exemplary embodiment of the present inventive concepts, the optical film POL may include a polarization film or a color filter.

A hole HH-P (hereinafter, an optical film hole) may be defined in the optical film POL to penetrate the optical film POL. The optical film hole HH-P may be defined in a region corresponding to the hole HH of the electronic panel EP. For example, as shown in the exemplary embodiment of FIG. 3A, the optical film hole HH-P may be defined in a region overlapping (e.g., in the third direction DR3) with the hole HH of the electronic panel EP and has the same shape as the hole HH of the electronic panel EP. However, exemplary embodiments of the present inventive concepts are not limited thereto. For example, in another exemplary embodiment, due to a process error or a process tolerance, there may be a difference in position and size between the hole HH of the electronic panel EP and the optical film hole HH-P. However, the hole HH of the electronic panel EP and the optical film hole HH-P may combine to form a main penetration hole.

The adhesion layer ADL may be disposed between the optical film POL and the window WM. For example, as shown in the exemplary embodiment of FIG. 3A, a bottom surface of the adhesion layer ADL may contact a top surface of the optical film POL. A top surface of the adhesion layer ADL may contact a bottom surface of the window WM. The adhesion layer ADL may be configured to attach the optical film POL and the window WM to each other. However, in another exemplary embodiment in which the optical film POL is the color filter disposed on the electronic panel EP, the adhesion layer ADL may attach the electronic panel EP and the window WM to each other. In an exemplary embodiment, the adhesion layer ADL may include an optical clear adhesive (OCA), an optical clear resin (OCR), or a pressure sensitive adhesive (PSA). However, exemplary embodiments of the present inventive concepts are not limited thereto.

An adhesion layer hole HH-A may be defined in the adhesion layer ADL to penetrate the adhesion layer. The adhesion layer hole HH-A may be formed in a region corresponding to the hole HH of the electronic panel EP. As shown in the exemplary embodiment of FIG. 3A, the adhesion layer hole HH-A and the optical film hole HH-P may at least partially overlap (e.g., in the third direction DR3) with the hole HH of the electronic panel EP. However, exemplary embodiments of the present inventive concepts are not limited thereto. For example, in other exemplary embodiments, the adhesion layer hole HH-A and the optical film hole HH-P may have a height difference from the hole HH of the electronic panel EP, due to a process error in a fabrication process. The adhesion layer hole HH-A may combine with the hole HH of the electronic panel EP and the optical film hole HH-P to form a main penetration hole.

The electronic module EM may be disposed below the window WM. For example, the electronic module EM may be disposed on the bottom surface of the external case HU. The electronic module EM may overlap with the hole HH (e.g., in the third direction DR3). The electronic module EM may receive an external input transmitted through the hole HH or may output a signal through the hole HH.

In an exemplary embodiment, the electronic module EM may include a receiving unit, which is used to receive an external input, and an outputting unit, which is used to provide an output. In this embodiment, the receiving and outputting units may overlap with the hole HH (e.g., in the third direction DR3). According to an exemplary embodiment of the present inventive concepts, the electronic module EM may be disposed to overlap with the active region AA (e.g., in the third direction DR3). Therefore, an increase in the area of the bezel region BZA to accommodate the electronic module EM may be prevented.

Referring to FIG. 3B, the electronic apparatus EA may include the electronic panel EP, a power supply module PM, a first electronic module EM1, and a second electronic module EM2. The electronic panel EP, the power supply module PM, the first electronic module EM1, and the second electronic module EM2 may be electrically connected to each other.

As shown in the exemplary embodiment of FIG. 3B, the electronic panel EP may include a displaying unit DU and a sensing unit SU. The displaying unit DU may include a plurality of pixels which are used to display the image IM. The sensing unit SU may sense an external input exerted on the window WM. In an exemplary embodiment, the external input may include various kinds of inputs, such as light, heat, or pressure, which are provided by a portion of the user's body or are provided elsewhere from the external environment. In addition, the electronic apparatus EA may sense an input that it is in contact therewith or is in proximity thereto. The sensing unit SU may be stacked on the displaying unit DU or may be incorporated into the displaying unit DU and may be integral therewith.

The first electronic module EM1 and the second electronic module EM2 may include various functional modules, which are used to operate the electronic apparatus EA. In an exemplary embodiment, the first electronic module EM1 may be directly mounted on a motherboard electrically connected to the electronic panel EP. However, exemplary embodiments of the present inventive concepts are not limited thereto. For example, in another exemplary embodiment, the first electronic module EM1 may be mounted on a separate substrate and may be electrically connected to a motherboard through a connector or the like.

The first electronic module EM1 may include a control module CM, a wireless communication module TM, an image input module JIM, an audio input module AIM, a memory MM, and an outer interface IF. In an exemplary embodiment, at least one of the modules may not be mounted directly on the motherboard and may be electrically connected to the motherboard through a flexible circuit board.

The control module CM may control overall operations of the electronic apparatus EA. In an exemplary embodiment, the control module CM may be a micro-processor. For example, the control module CM may activate or inactivate the electronic panel EP. The control module CM may control other modules, such as the image input module IIM or the audio input module AIM, based on an external input, such as a touch signal received from the electronic panel EP.

The wireless communication module TM may transmit and receive a wireless signal to and from another terminal via a Bluetooth or a Wi-Fi line. The wireless communication module TM may transmit and receive a voice signal via a typical communication line. The wireless communication module TM may include a transmitter TM1, which modulates and transmits a signal to be transmitted, and a receiver TM2, which demodulates a received signal.

The image input module IIM may process an image signal and convert it into image data that can be displayed on the electronic panel EP. The audio input module AIM may receive an external audio signal through a microphone in a recording mode, a voice recognizing mode, etc., and then convert it into electrical voice data.

The outer interface IF may serve as an interface that is connected to an external charger, a wired/wireless data port, a card socket (e.g., a memory card or a SIM/UIM card), etc.

The second electronic module EM2 may include an audio output module AOM, a light-emitting module LM, a light-receiving module LRM, and a camera module CMM. In an exemplary embodiment, the modules of the second electronic module EM2 may be directly mounted on a motherboard. However, exemplary embodiments of the present inventive concepts are not limited thereto. For example, in another exemplary embodiment, the modules of the second electronic module EM2 may be mounted on another substrate and may be electrically connected to the electronic panel EP or the first electronic module EM1 through a connector.

The audio output module AOM may convert audio data, which are transmitted from the wireless communication module TM or are stored in the memory MM, and may output the converted audio data to an external device.

The light-emitting module LM may generate and emit light. In an exemplary embodiment, the light-emitting module LM may emit infrared light. For example, the light-emitting module LM may include a light-emitting diode (LED) device. The light-receiving module LRM may sense the infrared light. The light-receiving module LRM may be activated, when an infrared light to be incident thereto has an intensity higher than a reference value. In an exemplary embodiment, the light-receiving module LRM may include a CMOS sensor. The infrared light emitted from the light-emitting module LM may be reflected by an external object (e.g., a user's finger or face) and may be incident into the light-receiving module LRM. The camera module CMM may be used to obtain an image of an external object.

The electronic module EM according to an exemplary embodiment of the present inventive concepts may include at least one of the components of the first and second electronic modules EM1 and EM2. For example, the electronic module EM may include at least one of a camera, a speaker, a light sensing sensor, or a heat sensing sensor. The electronic module EM may sense a signal on an external object, which is received through the hole HH, or may provide a sound signal (e.g., voice) to the outside through the hole HH. In addition, the electronic module EM may include a plurality of components, and the present inventive concepts are not limited to a specific exemplary embodiment.

The supporter TRS may be disposed in a region corresponding to the hole HH. For example, as shown in the exemplary embodiment of FIG. 4A, the supporter TRS may be disposed in a region overlapping the hole HH (e.g., in the third direction DR3) between the window WM and the electronic module EM. For example, the supporter TRS may be inserted into the hole HH of the electronic panel EP and the optical film hole HH-P. This will be described in more detail below. As shown in the exemplary embodiment of FIG. 4A, the supporter TRS may be disposed within the main penetration hole formed by the combination of the hole HH of the electronic panel EP, the optical film hole HH-P and an adhesion layer hole HH-A in a region disposed above the hole HH (e.g., within the adhesion layer hole HH-A and the optical film hole HH-P). However, in other exemplary embodiments, a portion of the supporter TRS may be disposed in the main penetration hole within the hole HH of the electronic panel EP.

The supporter TRS may be optically transparent. For example, in an exemplary embodiment of the present inventive concepts, the supporter TRS may have optical transmittance of about 90% or higher. Therefore, light, which is incident through the window WM, may be stably incident into the electronic module EM, without optical loss caused by the supporter TRS. In addition, light, which is emitted through the window WM, may be easily provided to the outside, without optical loss caused by the supporter TRS.

In an exemplary embodiment of the present inventive concepts, the electronic module EM may be assembled to overlap with the transmission region TA (e.g., in the third direction DR3). Accordingly, it may be possible to prevent an increase in the area of the bezel region BZA as compared to an apparatus which includes the electronic module EM in the bezel region and to improve the aesthetic quality and space efficiency of the electronic apparatus EA.

Figure 4A:
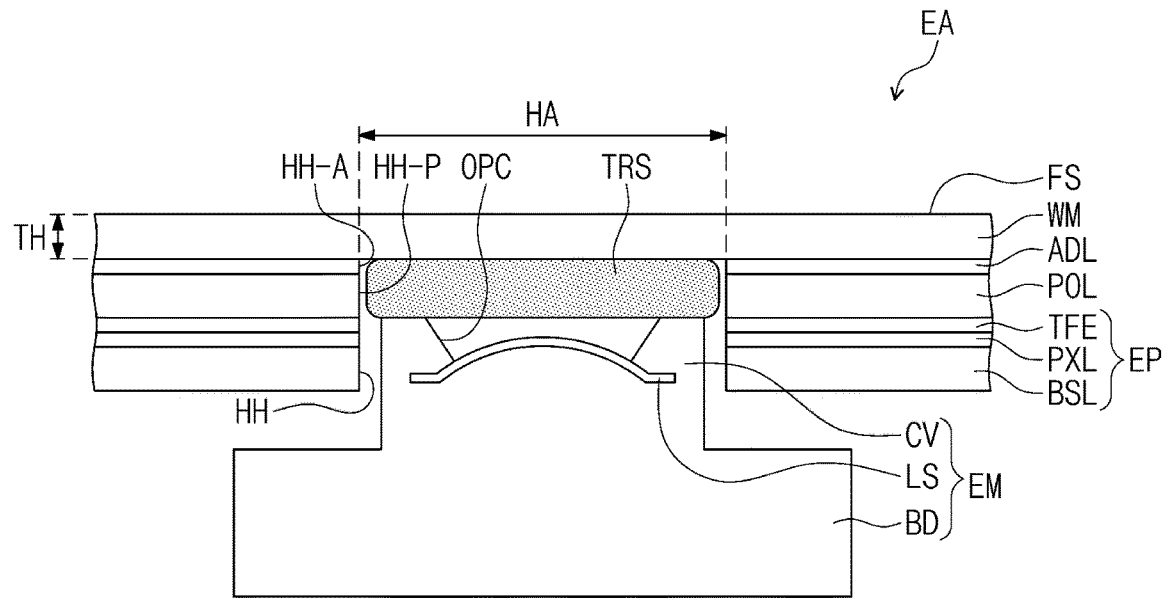
FIG. 4A is a cross-sectional view illustrating a portion of an electronic apparatus according to an exemplary embodiment of the present inventive concepts.
Figure 4B:
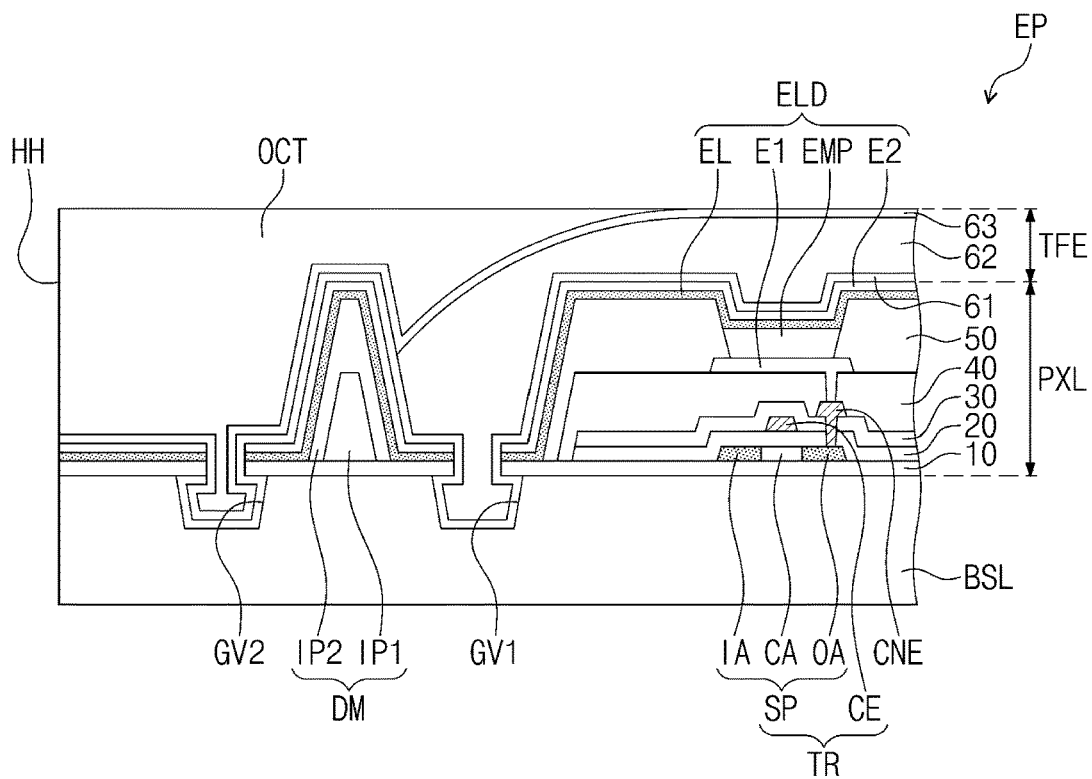
FIGS. 4B and 4C are cross-sectional views each illustrating a portion of an electronic panel according to exemplary embodiments of the present inventive concepts.
Figure 4C:
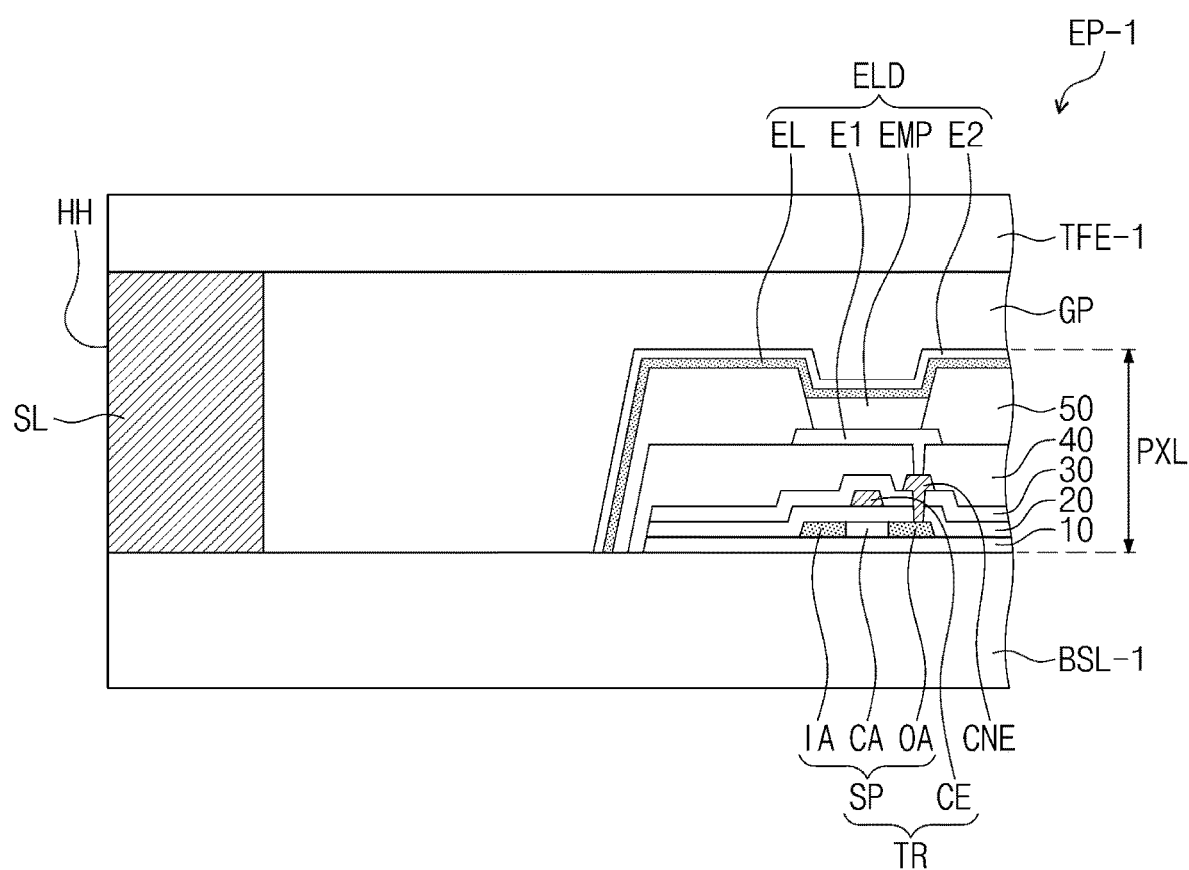

FIG. 4A is a cross-sectional view illustrating a portion of an electronic apparatus according to an exemplary embodiment of the present inventive concepts. FIGS. 4B and 4C are cross-sectional views illustrating a portion of an electronic panel according to exemplary embodiments of the present inventive concepts. For convenience of illustration, the hole HH and a region adjacent to the hole HH are illustrated in FIG. 4B, and a region corresponding to FIG. 4B is illustrated in FIG. 4C. Hereinafter, some exemplary embodiments of the present inventive concepts will be described with reference to FIGS. 4A to 4C.

As shown in FIG. 4A, in the electronic apparatus EA, the supporter TRS may be inserted into the hole HH, the optical film hole HH-P, and the adhesion layer hole HH-A. The hole HH, optical film hole HH-P and adhesion layer hole HH-A may combine to form a main penetration hole. A portion of the electronic module EM may be inserted into the hole HH and, when viewed in a cross-sectional view, it may be spaced apart from the window WM (e.g., in the third direction DR3) with the supporter TRS interposed therebetween. For example, as shown in the exemplary embodiment of FIG. 4A, a top surface of the supporter TRS may contact a bottom surface of the window WM and a bottom surface of the supporter may contact a top surface of the electronic panel EP.

The hole HH of the electronic panel EP may penetrate the electronic panel EP in the thickness direction of the electronic panel EP (e.g., in the third direction DR3). The electronic panel EP may include a base layer BSL, a pixel layer PXL, and an encapsulation layer TFE (e.g., a thin film encapsulation layer). The hole HH may penetrate the entirety of the base layer BSL, the pixel layer PXL, and the encapsulation layer TFE in the third direction DR3 (e.g., the thickness direction).

Referring to FIGS. 4B and 4C, the base layer BSL may have an electrically insulating property. In an exemplary embodiment of the present inventive concepts, the base layer BSL may have a flexible property. For example, the base layer BSL may be a resin substrate, a resin film, a thin metal substrate, a thin glass substrate, a stack including a plurality of stacked insulating layers, etc.

The pixel layer PXL may include a plurality of insulating layers 10, 20, 30, 40, and 50, a thin film transistor TR, and a light-emitting device ELD. The insulating layers 10, 20, 30, 40, and 50 may include first to fifth insulating layers 10, 20, 30, 40, and 50, which are sequentially stacked on the base layer BSL (e.g., in the third direction DR3).

The thin film transistor TR may include a control electrode CE, an input unit IA, a channel portion CA, and an output unit OA. As shown in the exemplary embodiment of FIG. 4A, the input unit IA, the channel portion CA, and the output unit OA may be portions of a semiconductor pattern SP, which is provided as a single, unitary object.

The channel portion CA may be defined in a region, which is a part of the semiconductor pattern SP and is overlapped with the control electrode CE (e.g., in the third direction DR3). The input unit IA and the output unit OA may be spaced apart from each other (e.g., in the first direction DR1) with the channel portion CA interposed therebetween. The input unit IA and the output unit OA may have higher carrier mobility than the channel portion CA. A doping concentration or a composition ratio of reduction metal of the input and output units IA and OA may be higher than the doping concentration or composition ratio of the channel portion CA.

However, exemplary embodiments of the present inventive concepts are not limited thereto. For example, in an exemplary embodiment, the thin film transistor TR may further include discrete input and output electrodes that are independently formed from the semiconductor pattern SP. Each of the input and output electrodes may be formed of a conductive material and may be coupled to the semiconductor pattern SP to constitute the thin film transistor TR. Each of the input and output electrodes may be coupled to the semiconductor pattern SP through at least one of the insulating layers 10, 20, 30, 40, and 50 or may be directly coupled to the semiconductor pattern SP. The structure of the thin film transistor TR may be variously changed, and exemplary embodiments of the present inventive concepts are not limited to a specific shape of the thin film transistor TR.

The light-emitting device ELD may be electrically connected to the thin film transistor TR. In the exemplary embodiment shown in FIG. 4B, the light-emitting device ELD is illustrated to be coupled to the output unit OA of the thin film transistor TR through a connection electrode CNE. However, exemplary embodiments of the present inventive concepts are not limited thereto. For example, in another exemplary embodiment, the light-emitting device ELD may be directly coupled to the output unit OA.

The light-emitting device ELD may include a first electrode E1, a light-emitting pattern EMP, a control layer EL, and a second electrode E2. The first electrode E1 may be disposed on the fourth insulating layer 40. The fifth insulating layer 50 may expose at least a portion of the first electrode E1.

The second electrode E2 may have a width (e.g., length in the first direction) that is large enough to cover at least the entire surface of the active region AA. Therefore, the second electrode E2 may extend (e.g., in the first direction) to provide the second electrode to a plurality of light-emitting devices. However, exemplary embodiments of the present inventive concepts are not limited thereto. For example, in another exemplary embodiment, the second electrode E2 may only extend (e.g., in the first direction) to correspond to a first pixel and separate second electrodes E2 may be provided in each pixel.

The light-emitting pattern EMP may be disposed on an exposed portion of the first electrode E1. The light-emitting pattern EMP may include at least one of various light-emitting materials, such as fluorescent or phosphorescent materials. The light-emitting materials may include organic or inorganic light emitting materials. However, exemplary embodiments of the present inventive concepts are not limited thereto.

The control layer EL may be disposed between the first electrode E1 and the second electrode E2. The control layer EL may have a width (e.g., length in the first direction DR1) that is large enough to cover at least the entire surface of the active region AA. The control layer EL may include an organic material. In an exemplary embodiment, the control layer EL may control movement of electric charges to improve light-emitting efficiency and life span of the light-emitting device ELD. The control layer EL may include an electron transport material, an electron injection material, a hole transport material, or a hole injection material.

Referring to FIG. 4B, the encapsulation layer TFE may be disposed on the pixel layer PXL to cover the pixel layer PXL. The encapsulation layer TFE may include inorganic layers 61 and 63 and an organic layer 62, which are stacked (e.g., in the third direction DR3). In the exemplary embodiment shown in FIG. 4B, the encapsulation layer TFE includes the first inorganic layer 61, the organic layer 62, and the second inorganic layer 63 that are sequentially stacked. However, exemplary embodiments of the present inventive concepts are not limited thereto. The encapsulation layer TFE may have a flexible property.

The electronic panel EP may further include recess patterns GV1 and GV2, a dam portion DM, and a planarization layer OCT. The recess patterns GV1 and GV2 may be spaced apart from each other (e.g., in the first direction DR1), and each of the recess patterns may be disposed along an edge of the hole HH. In an exemplary embodiment, the recess patterns GV1 and GV2 may be concave regions which are formed in a top surface of the base layer BSL by removing at least a portion of the base layer BSL. At least one of the first inorganic layer 61 and the second inorganic layer 63 may be disposed on a top surface of the recess patterns GV1 and GV2. For example, as shown in the exemplary embodiment of FIG. 4B, the first inorganic layer 61 may be disposed on the first recess pattern GV1 and the first inorganic layer 61 and second inorganic layer 63 may be disposed on the second recess pattern GV2. A portion of the control layer EL may be removed from regions overlapping with the recess patterns GV1 and GV2 (e.g., in the third direction DR3). Therefore, external moisture or other contamination material may be prevented from entering an internal portion of the electronic panel EP through the control layer EL.

The dam portion DM may prevent the organic layer 62 from overflowing so that the organic layer 62 may be confined to a particular desired region. As shown in the exemplary embodiment of FIG. 4B, the dam portion DM may be disposed between the recess patterns GV1 and GV2 (e.g., in the first direction DR1). However, exemplary embodiments of the present inventive concepts are not limited thereto. For example, in an exemplary embodiment, the dam portion DM may be provided in various different regions to prevent an excessive expansion of a region for the organic layer 62 and exemplary embodiments of the present inventive concepts are not limited to any specific embodiment for the dam portion DM.

The planarization layer OCT may cover the dam portion DM and/or the recess patterns GV1 and GV2. The planarization layer OCT may be disposed along the edge of the hole HH to expand the flat surface which is formed by the organic layer 62 to a region adjacent to the hole HH. In an exemplary embodiment, the planarization layer OCT may be formed of or include an organic material.

According to an exemplary embodiment of the present inventive concepts, the hole HH may be formed to penetrate the electronic panel EP. Accordingly, the base layer BSL, the pixel layer PXL, the encapsulation layer TFE, and the planarization layer OCT may be pierced by the hole HH and the lateral edges thereof may have side surfaces that are exposed toward an inner surface of the hole HH.

According to an exemplary embodiment of the present inventive concepts, the base layer BSL and the encapsulation layer TFE may be formed of flexible materials to improve a folding property of the electronic panel EP. Accordingly, the electronic panel EP may be easily folded by an external force. However, exemplary embodiments of the present inventive concepts are not limited thereto.

For example, as shown in the exemplary embodiment of FIG. 4C, an electronic panel EP-1 may be provided that is rigid. The base layer BSL-1 of the electronic panel EP-1 may be rigid. For example, the base layer BSL-1 may be provided to be thicker (e.g., have a greater length in the third direction DR3) than the base layer BSL shown in FIG. 4B or may be formed of more rigid materials, such as glass. Accordingly, the base layer BSL-1 may have a lower flexibility than the base layer BSL shown in FIG. 4B.

An encapsulation layer TFE-1 may be spaced apart from the pixel layer PXL (e.g., in the third direction DR3) with a gap GP interposed therebetween to encapsulate the pixel layer PXL. In an exemplary embodiment, the gap GP may be filled with the air, an inactive gas, an adhesive material, etc. The encapsulation layer TFE-1 may be relatively rigid in comparison with the encapsulation layer TFE shown in FIG. 4B. For example, in an exemplary embodiment, the encapsulation layer TFE-1 may be a glass substrate. Accordingly, the encapsulation layer TFE-1 may have a lower flexibility than the flexibility of the encapsulation layer TFE shown in FIG. 4B.

The electronic panel EP-1 may further include a sealing portion SL. The sealing portion SL may maintain the gap GP and may attach the encapsulation layer TFE to the base layer BSL. The sealing portion SL may be disposed along the edge of the hole HH. In an exemplary embodiment, the sealing portion SL may have a ring shape which encloses the edge of the hole HH. The sealing portion SL may hermetically seal the gap GP to prevent the pixel layer PXL from being damaged even when the electronic panel EP-1 is pierced by the hole HH.

The electronic panel EP-1 shown in FIG. 4C may have a relatively low flexibility and high stiffness as compared with the electronic panel EP shown in FIG. 4B. Accordingly, the electronic panel EP-1 may maintain a high stability under an external impact exerted on the electronic panel EP-1 and has an impact-resistant property.

Referring back to FIG. 4A, the supporter TRS may be disposed in the main penetration hole in a region which overlaps with the hole HH (e.g., in the third direction DR3), to support the electronic module EM and the window WM. As shown in the exemplary embodiment of FIG. 4A, the electronic module EM may include a body portion BD, an upper portion CV, and a lens LS. In an exemplary embodiment, the body portion BD may be provided to have a width (e.g., length in the first direction DR1) that is larger than a width of the hole HH. In an exemplary embodiment, the body portion BD may include various driving devices or various circuit substrates which are used to drive the electronic module EM.

The upper portion CV of the electronic module EM may protrude upward from the body portion BD (e.g., in the third direction DR3). The upper portion CV may have a width (e.g., length in the first direction DR1) that is smaller than the width of the body portion BD. The width of the upper portion CV may be smaller than the width of the hole HH so that the upper portion may be disposed within the hole. An opening OPC may be defined in the upper portion CV. The lens LS may be exposed to the outside through the opening OPC. However, exemplary embodiments of the present inventive concepts are not limited thereto, and the structure of the electronic module EM may be variously changed and may still receive or output light through the hole HH.

As shown in the exemplary embodiment of FIG. 4A, the supporter TRS may be in contact with each of the window WM and the upper portion CV of the electronic module EM. For example, a top surface of the supporter TRS may contact a bottom surface of the window WM and a bottom surface of the supporter TRS may contact a top portion of the upper portion CV of the electronic module EM. However, exemplary embodiments of the present inventive concepts are not limited thereto. For example, in another exemplary embodiment, a separation space may exist between the supporter TRS, the window WM, and the electronic module EM (e.g., in the third direction DR3), and deformation of the window WM or collision between the window WM and the electronic module EM may still be prevented.

In an exemplary embodiment, the window WM may have a relatively thin thickness (e.g., length in the third direction DR3). For example, in an exemplary embodiment a thickness TH of the window WM may be less than or equal to about 50 μm. However, exemplary embodiments of the present inventive concepts are not limited thereto. Therefore, the window WM of the electronic apparatus EA may be highly flexible. According to an exemplary embodiment of the present inventive concepts, the supporter TRS may be inserted in the hole HH and may be disposed within the main penetration hole between the electronic module EM and the window WM (e.g., in the third direction DR3) to support the window WM. Accordingly, the electronic apparatus EA which includes the supporter TRS may have improved durability.

Figure 5A:
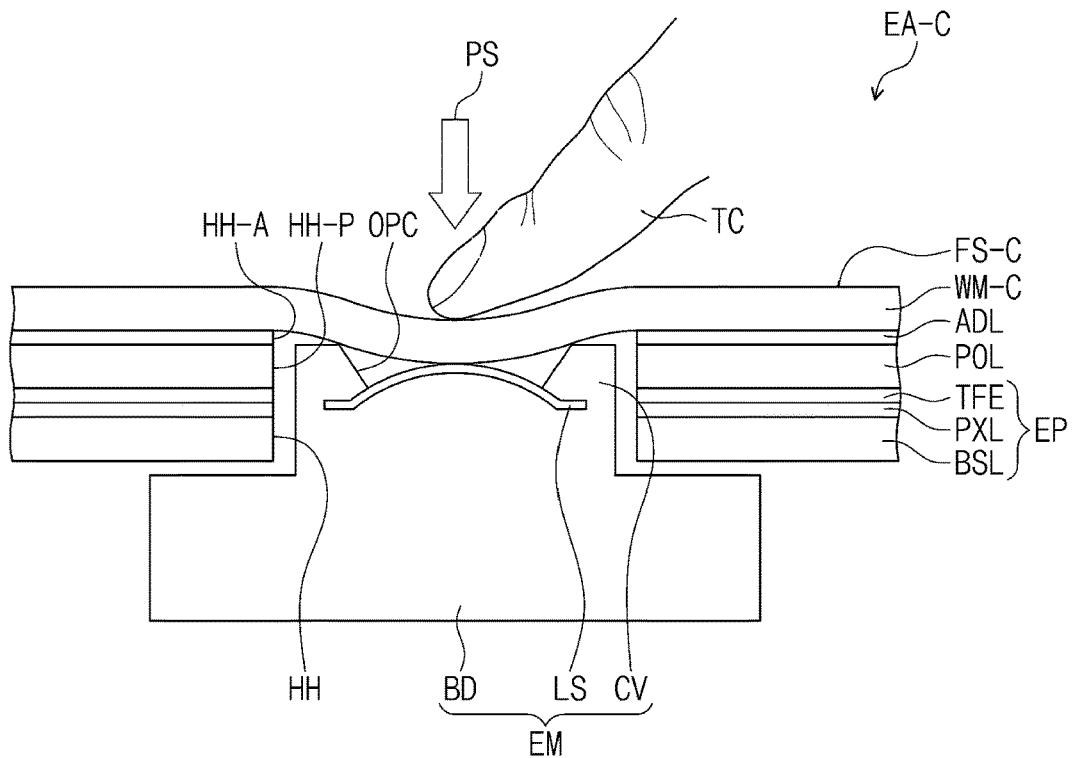
FIG. 5A is a cross-sectional view illustrating a portion of an electronic apparatus according to a comparative embodiment.
Figure 5B:
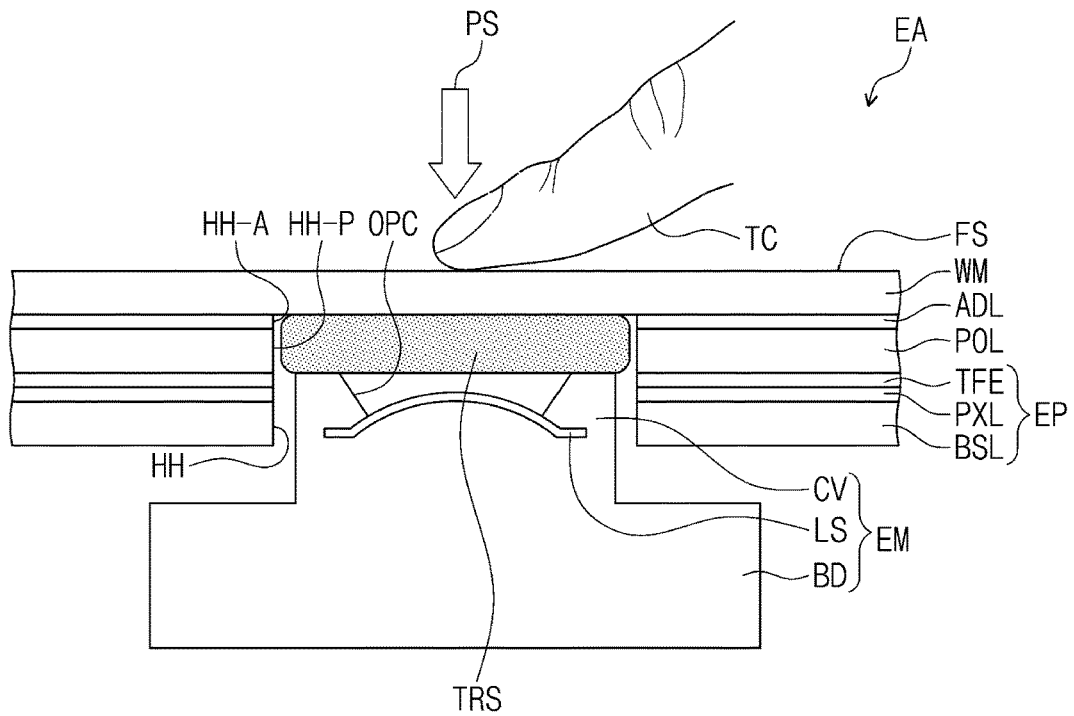
FIG. 5B is a cross-sectional view illustrating a portion of an electronic apparatus according to an exemplary embodiment of the present inventive concepts.

FIG. 5A is a cross-sectional view illustrating a portion of an electronic apparatus according to a comparative embodiment. FIG. 5B is a cross-sectional view illustrating a portion of an electronic apparatus according to an exemplary embodiment of the present inventive concepts. FIG. 5A illustrates an electronic apparatus according to a comparative embodiment EA-C, which does not includes the supporter TRS of the electronic apparatus EA of FIG. 4A. FIG. 5B illustrates the electronic apparatus EA of FIG. 4A. For convenience of explanation, a duplicative description of like parts in FIGS. 5A-5B will be omitted.

Referring to FIGS. 5A and 5B, an external input TC (e.g., a user's finger) may be exerted on the electronic apparatus FA-C or EA. The external input TC may be provided on a front surface FS-C or FS of the electronic apparatus EA-C or EA. In an exemplary embodiment, the external input TC may be a change in pressure PS that is exerted on the front surface FS-C and FS in the thickness direction (e.g., the third direction DR3) of the electronic apparatus EA-C or EA. The pressure PS may be substantially exerted on a window WM-C or WM which may define the front surface FS-C or FS of the electronic apparatus EA-C or EA. The pressure PS may be strong enough to cause the deformation of the window WM-C or WM.

As shown in the comparative embodiment of FIG. 5A, the window WM-C of the electronic apparatus EA-C may be deformed or bent by the pressure PS such that at least a portion of the window WM-C contacts the electronic module EM. For example, as shown in FIG. 5A, the pressure PS caused by the external input TC causes the window WM-C to deform in the third direction DR3 toward the base layer BSL and the bottom surface of the window WM-C contacts an upper portion of the lens LS. In the comparative embodiment, a physical impact may occur between the window WM-C and the electronic module EM which causes damage to the window WM-C and/or the electronic module EM.

By contrast, as shown in FIG. 5B, the electronic apparatus EA according to an exemplary embodiment of the present inventive concepts may further include the supporter TRS. The supporter TRS may be disposed between the electronic module EM and the window WM (e.g., in the third direction DR3) and supports the electronic module EM and the window WM. Therefore, even when the pressure PS is exerted on the window WM, the window WM may be supported by the supporter TRS to prevent the window WM from being deformed. Thus, the window WM and the electronic module EM may be prevented from being damaged by colliding with each other due to the pressure PS exerted on the window WM.

In an exemplary embodiment, the supporter TRS may have an elastic property. For example, the supporter TRS may have an elastic property which allows it to be deformed by the pressure PS but does not allow it to be displaced and make contact with a portion of the electronic module EM, such as the lens LS. For example, in an exemplary embodiment, the supporter TRS may include silicone or rubber or may be formed in the form of gel or semi-liquid. However, exemplary embodiments of the present inventive concepts are not limited thereto. The supporter TRS may also be provided to have flexibility that is lower than the flexibility of the window WM. Accordingly, it may be possible to stably prevent the window WM from being deformed by the external pressure PS.

According to an exemplary embodiment of the present inventive concepts, since the electronic apparatus EA includes the supporter TRS, a gap between the window WM and the electronic module EM may be stably maintained. Accordingly, it may be possible to suppress or prevent the window WM from being deformed by the external pressure PS to prevent the window WM from colliding with the electronic module EM, and to improve the durability of the electronic apparatus FA.

Figure 6A:
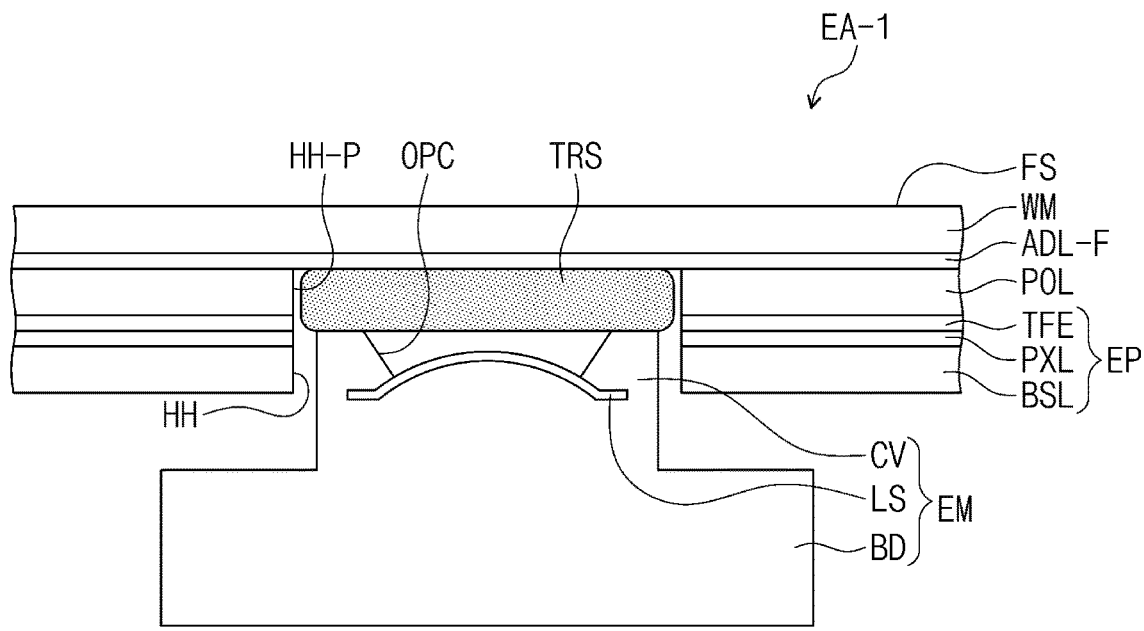
FIGS. 6A and 6B are cross-sectional views illustrating an electronic apparatus according to exemplary embodiments of the present inventive concepts.
Figure 6B:
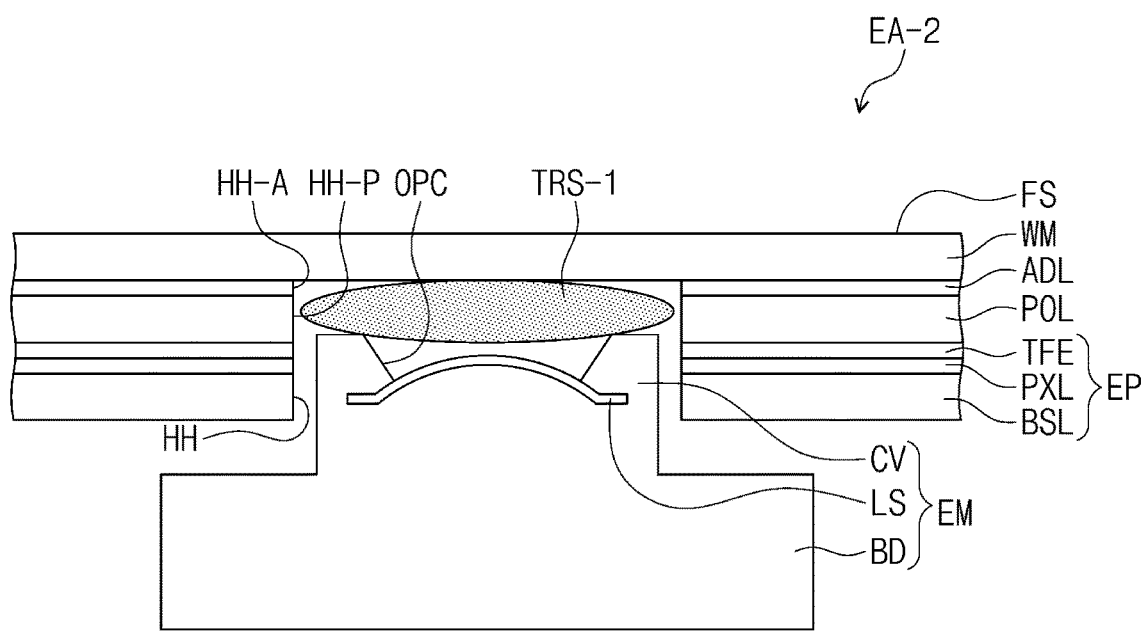

FIGS. 6A and 6B are cross-sectional views illustrating an electronic apparatus according to exemplary embodiments of the present inventive concepts. For convenience in illustration, each of FIGS. 6A and 6B illustrates a region corresponding to FIG. 4A. Hereinafter, exemplary embodiments of the present inventive concepts will be described with reference to FIGS. 6A and 6B. For concise description, an element previously described with reference to FIGS. 1 to 5B may be identified by the same reference number without repeating a description of such elements.

As shown in FIG. 6A, an electronic apparatus EA-1 may include an adhesion layer ADL-F. A hole may not be defined in the adhesion layer ADL-F, unlike the adhesion layer ADL of FIG. 4A which includes hole HH-A defined therein. The adhesion layer ADL-F may be formed as a single object and may fully overlap the electronic module EM and the electronic panel EP (e.g., in the third direction DR3). Therefore, in this exemplary embodiment, the optical film hole HH-P and the hole HH of the electronic panel EP may combine to form a main penetration hole. In this embodiment, the top surface of the supporter TRS may directly contact a bottom surface of the adhesion layer DL-F and a bottom surface of the supporter TRS may contact a top surface of the upper portion CV of the electronic module EM.

The supporter TRS may be attached to the adhesion layer ADL-F. The supporter TRS may be attached to the window WM through the adhesion layer ADL-F. Accordingly, it may be possible to fixedly maintain the position of the supporter TRS between the window WM and the electronic module EM within the main penetration hole.

Alternatively, as shown in the exemplary embodiment of FIG. 6B, an electronic apparatus EA-2 may include a supporter TRS-1. The supporter TRS-1 may have a different shape from the supporter TRS of FIG. 4A. For example, the supporter TRS-1 may have a shape of a convex lens. The supporter TRS-1 may guide light, which is incident through the front surface FS, onto the opening OPC of the electronic module EM. The supporter TRS-1 may increase a light concentration property of the electronic apparatus EA-2.

According to exemplary embodiments of the present inventive concepts, in the electronic apparatus EA-1, the shape of the adhesion layer ADL-F may be variously changed provided that optical efficiency of the electronic module EM does not significantly deteriorate. Furthermore, in the electronic apparatus EA-2, the shape of the supporter TRS-1 may be variously changed provided that the window WM is stably maintained.

Figure 7A:
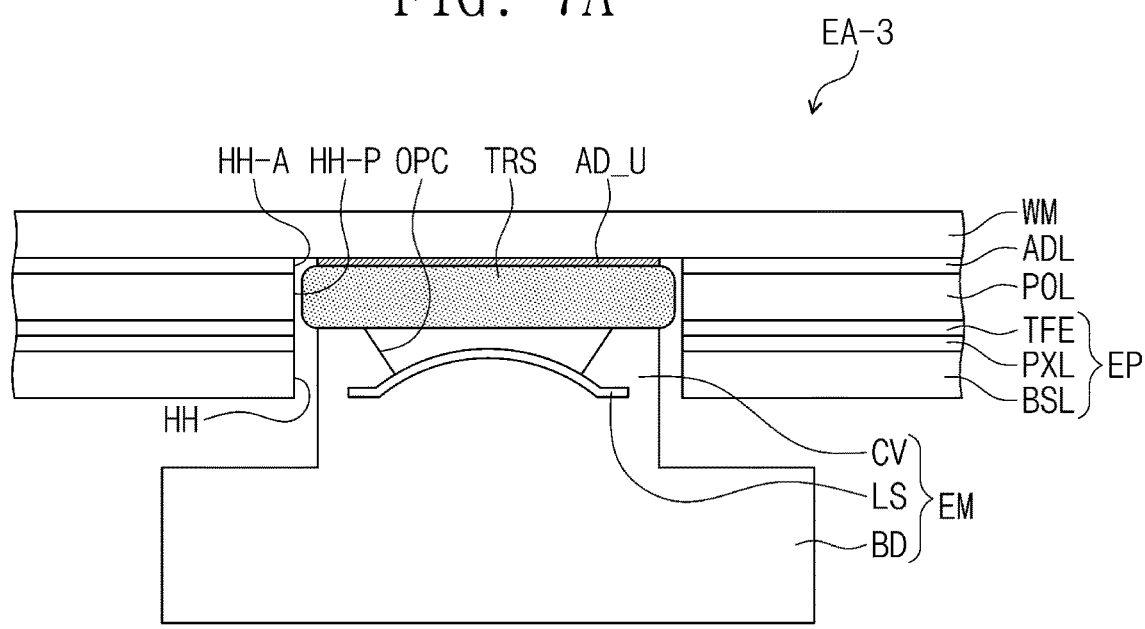
FIGS. 7A and 7B are cross-sectional views illustrating an electronic apparatus according to exemplary embodiments of the present inventive concepts.
Figure 7B:
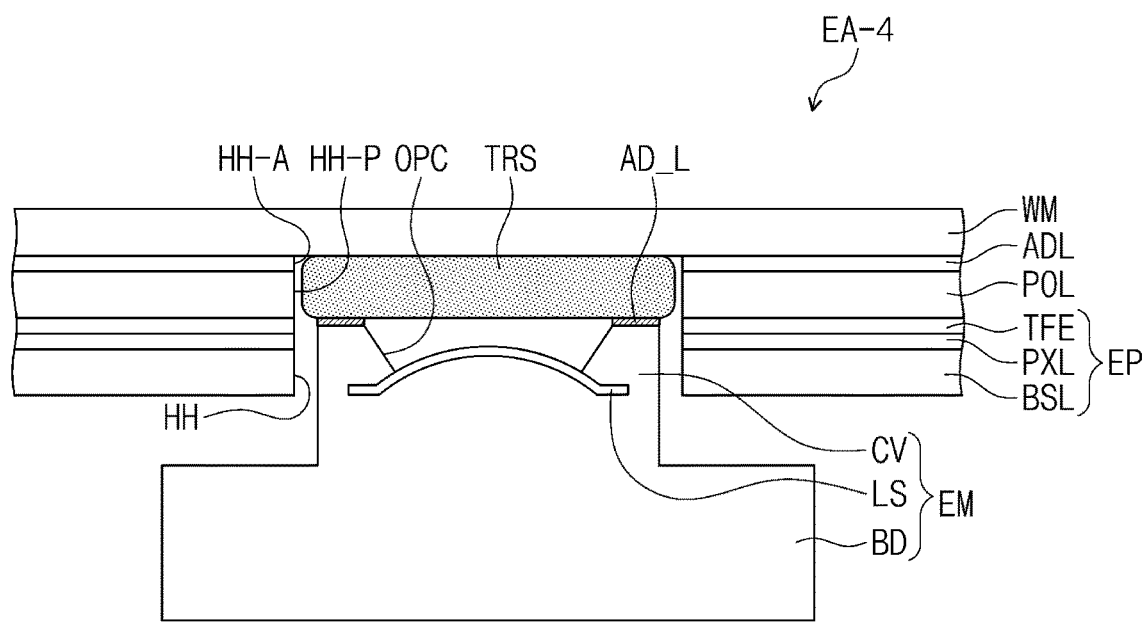

FIGS. 7A and 7B are cross-sectional views illustrating a supporter and an electronic module according to exemplary embodiments of the present inventive concepts. For convenience in illustration, each of FIGS. 7A and 7B illustrates a region corresponding to FIG. 4A. Hereinafter, some exemplary embodiments of the present inventive concepts will be described with reference to FIGS. 7A and 7B. For concise description, an element previously described with reference to FIGS. 1 to 6B may be identified by the same reference number without repeating a description of such elements.

As shown in FIG. 7A, an electronic apparatus EA-3 may further include an upper adhesion layer AD_U. The upper adhesion layer AD_U may be disposed between the supporter TRS and the window WM (e.g., in the third direction DR3) to attach the supporter TRS to the window WM. For example, a top surface of the supporter TRS may contact the upper adhesion layer AD_U and the bottom surface of the supporter may contact a top surface of the upper portion CV of the electronic module EM.

In an exemplary embodiment, the upper adhesion layer AD_U may be optically transparent. For example, the upper adhesion layer AD_U may include an optical clear adhesive (OCA), an optical clear resin (OCR), or a pressure sensitive adhesive (PSA). However, exemplary embodiments of the present inventive concepts are not limited thereto.

Alternatively, as shown in FIG. 7B, an electronic apparatus EA-4 may further include a lower adhesion layer AD_L. The lower adhesion layer AD_L may be disposed between the supporter TRS and the electronic module EM (e.g., in the third direction DR3) to attach the supporter TRS with the electronic module EM. For example, outer lateral edges of the supporter (e.g., in the first direction DR1) may directly contact the lower adhesion layer AD_L and the bottom surface of the supporter may contact a top surface of the upper portion CV of the electronic module EM.

In the exemplary embodiment shown in FIG. 7B, the lower adhesion layer AD_L is illustrated as overlapping (e.g., in the third direction DR3) with the upper portion CV of the electronic module EM but not with the opening OPC. Accordingly, even when the lower adhesion layer AD_L is optically opaque, it may be possible to prevent the lower adhesion layer AD_L from affecting light that is incident into the electronic module EM or is emitted from the electronic module EM. However, exemplary embodiments of the present inventive concepts are not limited thereto. For example, in another exemplary embodiment, the lower adhesion layer AD_L may be optically transparent and the lower adhesion layer AD_L may cover the opening OPC.

Figure 8A:
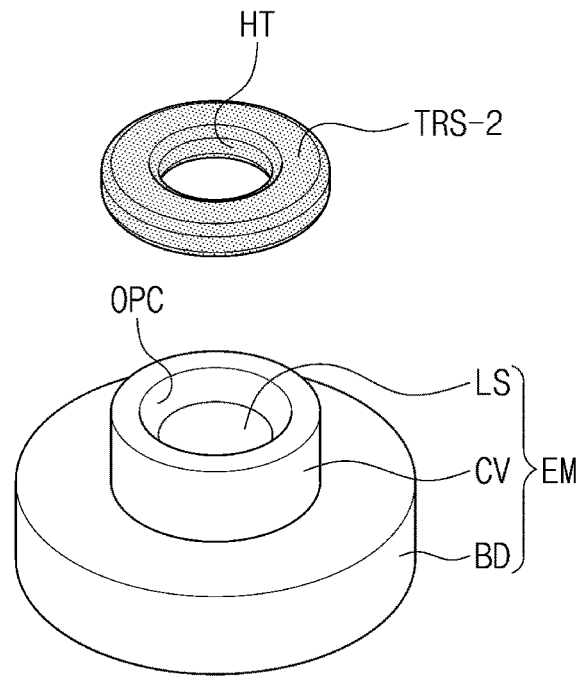
FIG. 8A is a perspective view illustrating a supporter and an electronic module according to an exemplary embodiment of the present inventive concepts.
Figure 8B:
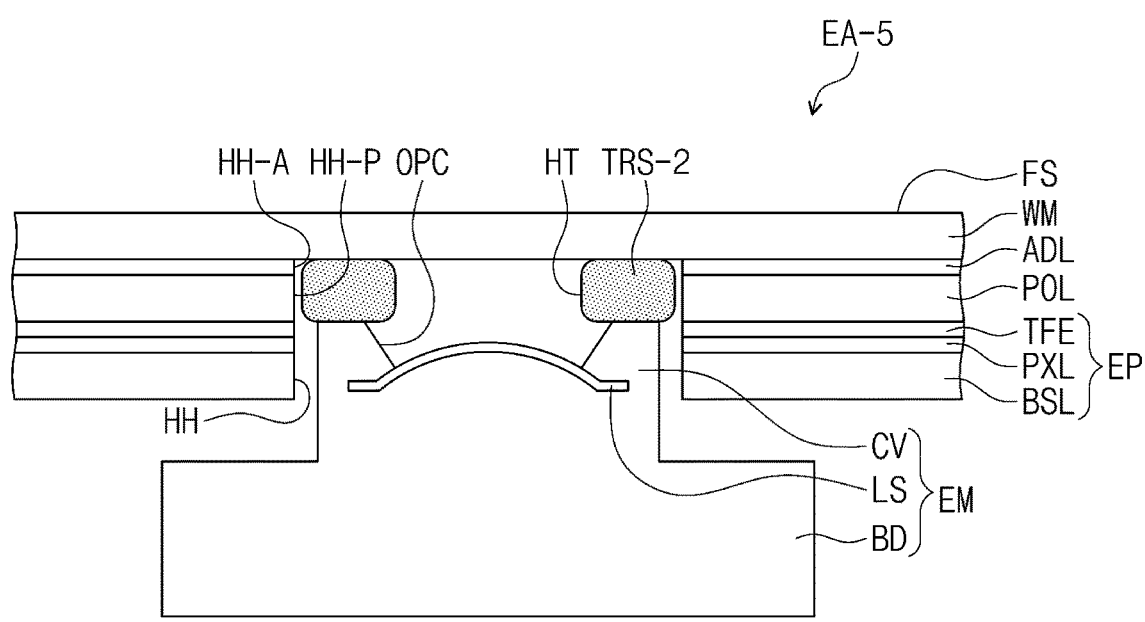
FIG. 8B is a cross-sectional view illustrating a portion of an electronic apparatus according to an exemplary embodiment of the present inventive concepts.

FIG. 8A is a perspective view illustrating a supporter and an electronic module according to an exemplary embodiment of the present inventive concepts. FIG. 8B is a cross-sectional view illustrating a portion of an electronic apparatus according to an exemplary embodiment of the present inventive concepts. For convenience in illustration, FIG. 8A illustrates the electronic module EM and a supporter TRS-2, and FIG. 8B illustrates a region corresponding to FIG. 4A. Hereinafter, an exemplary embodiment of the present inventive concepts will be described with reference to FIGS. 8A and 8B. For concise description, an element previously described with reference to FIGS. 1 to 7B may be identified by the same reference number without repeating a description of such elements.

As shown in FIGS. 8A and 8B, an electronic apparatus EA-5 may include the supporter TRS-2. The supporter TRS-2 may have a different shape from the supporter TRS shown in FIG. 4A. For example, the supporter TRS-2 may have a ring shape and a supporter hole HT may be defined in the supporter TRS-2. For example, as shown in the exemplary embodiment of FIG. 8A, the penetration hole HT may be defined in a central portion of the supporter TRS-2.

The penetration hole HT of the supporter TRS-2 may overlap (e.g., in the third direction DR3) with at least a portion of the opening OPC of the electronic module EM. For example, the supporter TRS-2 may have a shape corresponding to the supporter TRS of FIG. 4A, from which a portion that overlaps (e.g., in the third direction DR3) with the opening OPC is removed. Accordingly, the supporter TRS-2 may overlap with the upper portion CV of the electronic module EM in the third direction DR3, and at least a portion of the lens LS may not be overlapped with the supporter TRS-2 in the third direction DR3.

According to an exemplary embodiment of the present inventive concepts, the electronic module EM may directly receive light, which is incident to the window WM but without the incident light traveling through the supporter TRS-2, or may directly emit light through the window WM but without the emitted light traveling through the supporter TRS-2. Thus, the supporter TRS-2 may reduce the loss of light entering or exiting the electronic module EM, while supporting the window WM.

According to an exemplary embodiment of the present inventive concepts, a deformation of a window and a collision of the electronic module with the window due to an external pressure or impact may be prevented. Accordingly, the durability of an electronic apparatus may be improved.

While exemplary embodiments of the present inventive concepts have been particularly shown and described, it will be understood by one of ordinary skill in the art that variations in form and detail may be made therein without departing from the spirit and scope of the attached claims.

What is claimed is:

1. An electronic apparatus, comprising:
   an electronic panel displaying an image, the electronic panel including a pixel layer having a plurality of pixels and a penetration hole that penetrates the electronic panel including the pixel layer;
   an electronic module overlapping the penetration hole in a thickness direction of the electronic apparatus and including a camera or a sensor;
   a window spaced apart from the electronic module in the thickness direction of the electronic apparatus and includes a transmission region and a bezel region, wherein the electronic panel is interposed between the window and the electronic module; and
   a supporter disposed between the window and the electronic module, the supporter disposed in an inner space of a main penetration hole formed at least partially by the penetration hole that penetrates the electronic panel, wherein the supporter is optically transparent, and
   wherein the supporter overlaps the transmission region.

2. The electronic apparatus of claim 1, wherein the supporter has an elastic property.

3. The electronic apparatus of claim 1, wherein the supporter has a shape of a convex lens.

4. The electronic apparatus of claim 1, further comprising an adhesion layer that is disposed between the supporter and the window to attach the supporter to the window.

5. The electronic apparatus of claim 1, further comprising an adhesion layer that is disposed between the supporter and the electronic module to attach the supporter and the electronic module to each other.

6. The electronic apparatus of claim 5, wherein the adhesion layer is configured to expose at least a portion of the supporter.

7. The electronic apparatus of claim 1, wherein at least a portion of the electronic module is positioned within the penetration hole.

8. The electronic apparatus of claim 1, further comprising:
an optical film disposed between the electronic panel and the window; and
an adhesion layer disposed between the optical film and the window,
wherein the optical film has a hole that penetrates the optical film and forms a portion of the main penetration hole.

9. The electronic apparatus of claim 8, wherein the adhesion layer is optically transparent.

10. The electronic apparatus of claim 8, wherein the adhesion layer has a hole that penetrates the adhesion layer and forms a portion of the main penetration hole.

11. The electronic apparatus of claim 8, wherein:
the adhesion layer overlaps with the penetration hole; and
the supporter is attached to the adhesion layer.

12. The electronic apparatus of claim 1, wherein the window is foldable along a predetermined folding axis.

13. The electronic apparatus of claim 12, wherein the window has a thickness of about 50 μm or less.

14. An electronic apparatus, comprising:
an electronic panel displaying an image, the electronic panel including a pixel layer having a plurality of pixels and a penetration hole that penetrates the electronic panel including the pixel layer;
an electronic nodule including a camera or a sensor, wherein at least a portion of the electronic module is positioned within the penetration hole;
a flexible window disposed on the electronic panel and configured to cover the penetration hole and includes a transmission region and a bezel region; and
a supporter overlapping with the penetration hole and disposed between the electronic module and the window, the supporter disposed in an inner space of the penetration hole,
wherein the supporter is optically transparent, and
wherein the supporter overlaps the transmission region.

15. The electronic apparatus of claim 14, wherein the supporter has an elastic property.

16. The electronic apparatus of claim 14, wherein:
the electronic panel comprises a base layer, the pixel layer, which is disposed on the base layer, and an encapsulation layer disposed on the pixel layer.

17. The electronic apparatus of claim 14, wherein the window comprises polyimide or glass.

18. The electronic apparatus of claim 14, wherein the supporter has a shape of a convex lens.

* * * * *